(12) United States Patent  
Suzuki

(10) Patent No.: US 7,622,745 B2  
(45) Date of Patent: Nov. 24, 2009

(54) EPITAXIAL WAFER FOR A SEMICONDUCTOR LIGHT EMITTING DEVICE, METHOD FOR FABRICATING THE SAME AND SEMICONDUCTOR LIGHT EMITTING DEVICE

(75) Inventor: Ryoji Suzuki, Mito (JP)

(73) Assignee: Hitachi Cable, Ltd., Tokyo (JP)

( * ) Notice: Subject to any disclaimer, the term of this patent is extended or adjusted under 35 U.S.C. 154(b) by 477 days.

(21) Appl. No.: 11/505,877

(22) Filed: Aug. 18, 2006

(65) Prior Publication Data

US 2007/0045651 A1 Mar. 1, 2007

(30) Foreign Application Priority Data

Aug. 30, 2005 (JP) ............................. 2005-248904  
Jul. 3, 2006 (JP) ............................. 2006-183643

(51) Int. Cl.
- H01L 33/00 (2006.01)
- H01S 5/00 (2006.01)
- H01S 5/343 (2006.01)
- H01S 3/18 (2006.01)

(52) U.S. Cl. ................. 257/96; 257/97; 257/102; 257/103; 257/201; 257/615; 257/E33.027; 257/E33.029; 257/E33.031; 257/E33.032; 438/47

(58) Field of Classification Search ............ 438/29, 438/46, 47, 761; 117/954; 257/94, 96, 97, 257/102, 103, 201, 615, 12, 13, 14, E33.023, 257/E33.026, E33.027, E33.029, E33.031, 257/E33.032, E21.085

See application file for complete search history.

(56) References Cited

U.S. PATENT DOCUMENTS

| | | | | |
|---|---|---|---|---|
| 5,278,857 | A * | 1/1994 | Yuge et al. | 372/45.01 |
| 5,488,233 | A * | 1/1996 | Ishikawa et al. | 257/94 |
| 6,181,723 | B1 * | 1/2001 | Okubo et al. | 372/45.01 |
| 6,229,834 | B1 * | 5/2001 | Nisitani et al. | 372/45.01 |
| 6,265,732 | B1 * | 7/2001 | Nakatsu et al. | 257/86 |
| 6,351,480 | B1 * | 2/2002 | Akagi | 372/45.01 |
| 6,377,598 | B1 * | 4/2002 | Watanabe et al. | 372/46.01 |
| 6,528,823 | B2 * | 3/2003 | Akaike et al. | 257/79 |
| 7,436,870 | B2 * | 10/2008 | Ono et al. | 372/43.01 |
| 7,449,720 | B2 * | 11/2008 | Suzuki et al. | 257/80 |

(Continued)

FOREIGN PATENT DOCUMENTS

CN 1347160 A 5/2002

(Continued)

OTHER PUBLICATIONS

Machine Translation of Japanese Publication No. 09-069667; Mar. 11, 1997.*

Primary Examiner—M. Wilczewski  
(74) Attorney, Agent, or Firm—Foley & Lardner LLP

(57) ABSTRACT

A n-type GaAs buffer layer 2, a n-type GaInP buffer layer 3, a n-type AlGaInP cladding layer 4, an undoped AlGaAs guide layer 5, an AlGaAs/GaAs multiquantum well (MQW) active layer 6, a first p-type AlGaInP cladding layer 7, a p-type GaInP etching stopper layer 8, a second p-type AlGaInP cladding layer 9, a C-doped AlGaAs layer (Zn-diffusion suppressing layer) 10, a p-type GaInP intermediate layer 11, and a p-type GaAs cap layer 12 are sequentially grown on a n-type GaAs substrate 1.

20 Claims, 4 Drawing Sheets

U.S. PATENT DOCUMENTS

| | | |
|---|---|---|
| 2002/0036296 A1 | 3/2002 | Akaike et al. |
| 2003/0206566 A1* | 11/2003 | Ohitsu et al. ............... 372/45 |
| 2007/0045651 A1* | 3/2007 | Suzuki ...................... 257/102 |
| 2007/0086498 A1* | 4/2007 | Ono et al. ................. 372/43.01 |
| 2009/0140273 A1* | 6/2009 | Takeuchi et al. ............ 257/94 |

FOREIGN PATENT DOCUMENTS

| | | |
|---|---|---|
| JP | 9-69667 A | 3/1997 |
| JP | 11-186665 A | 7/1999 |
| JP | 2002-261321 A | 9/2002 |

* cited by examiner

EPITAXIAL WAFER FOR A SEMICONDUCTOR LIGHT EMITTING DEVICE, METHOD FOR FABRICATING THE SAME AND SEMICONDUCTOR LIGHT EMITTING DEVICE

The present application is based on Japanese Patent Application No. 2005-248904 filed on Aug. 30, 2005 and Japanese Patent Application No. 2006-183643 filed on Jul. 3, 2006, the entire contents of which are incorporated herein by reference.

BACKGROUND OF THE INVENTION

1. Field of the Invention

The present invention relates to an epitaxial wafer for a semiconductor light emitting device, a method for fabricating the same and a semiconductor light emitting device, more particularly, to an epitaxial wafer for a semiconductor light emitting device (such as a light emitting diode, a semiconductor laser), which includes aluminum gallium indium phosphide (AlGaInP) based material using zinc (Zn) or magnesium (Mg) as a p-type dopant, a method for fabricating the same, and a semiconductor light emitting device fabricated by using the epitaxial wafer for a semiconductor light emitting device.

2. Description of the Related Art

In recent years, the high density optical disk apparatus using an AlGaInP based visible light semiconductor laser as a light source has been positively developed among the semiconductor lasers. The Fabry-Perot type laser diode (LD) used for this light source has a layered structure in which at least a n-type AlGaInP cladding layer, an active layer, a p-type AlGaInP cladding layer, and a p-type GaAs cap layer are sequentially laminated on a n-type GaAs substrate by using the Metalorganic Vapor Phase Epitaxy method (MOVPE method). If necessary, a n-type GaAs buffer layer, and further a n-type GaInP buffer layer may be interposed between the n-type GaAs substrate and the n-type AlGaInP cladding layer. Further, if necessary, a p-type GaInP intermediate layer may be interposed between the p-type AlGaInP cladding layer and the p-type GaAs cap layer. Still further, if necessary, an epitaxial wafer having a configuration in which a GaInP layer is interposed into a part of the p-type AlGaInP cladding layer may be used for the etching control in the process and the design of a refractive index.

For a light source for reading/writing in a high density optical disk apparatus, a stable operation with high power at a high temperature required. Accordingly, it is necessary to increase a carrier concentration of the p-type cladding layer to provide a high carrier concentration. Zn or Mg may be used as the p-type dopant satisfying this request. Japanese Patent Laid-Open No. 11-186665 discloses an example in which Zn is used as the p-type dopant for the p-type cladding layer.

However, there is a problem in that the dopant is diffused from the p-type cladding layer to the active layer. When the diffused amount of the dopant is much, a critical defect for a function as a semiconductor laser device will be caused. Herein, Zn is relatively easily diffused while Mg is hardly diffused. Therefore, the recent tendency is to form the p-type cladding layer by using Mg having a small diffusion constant in comparison with Zn. Since Mg is hardly diffused compared with Zn, the carrier concentration of the p-type cladding layer can be made higher by doping Mg.

On the other hand, from the need to decrease a contact resistance of an electrode as low as possible, the carrier concentration of the p-type cap layer (contact layer) should be increased to provide a high carrier concentration. This p-type cap layer is generally made of gallium arsenide (GaAs), and Zn is used as a dopant for realizing a high carrier concentration, since the carrier concentration of the p-type cap layer should be higher by 1 digit than that of the cladding layer, as disclosed by Japanese Patent Laid-Open No. 11-186665.

In addition, it is proposed by Japanese Patent Laid-Open No. 2002-261321 that a diffusion control layer is interposed between the p-type cladding layer and the active layer, and the diffusion control layer is mainly composed of a GaAs-based compound semiconductor and contains carbon (C) of a concentration of $5 \times 10^{18}/cm^3$ to $1 \times 10^{20}/cm^3$. As for this, the carbon (C) in the diffusion control layer becomes a barrier and the dopant diffusion of Zn or Mg doped in the p-type cladding layer or the active layer can be effectively controlled.

As shown in the conventional arts such as Japanese Patent Laid-Open No. 11-186665 and Japanese Patent Laid-Open No. 2002-261321, the attention has been paid to the prevention of a disadvantage in that Zn in the p-type cladding layer enters into the active layer. For example, in Japanese Patent Laid-Open No. 2002-261321, the diffusion control layer containing the carbon (C) is interposed between the p-type cladding layer and the active layer. The diffusion control layer is a layer for absorbing Zn diffused from the p-type cladding layer so as to reduce the amount of Zn diffused in the active layer.

However, as described below, it is necessary to prevent Zn of the p-type cap layer from entering into the p-type cladding layer and the active layer.

In more concrete, if the p-type cap layer is doped with Zn with a high concentration, Zn will be rapidly diffused into lower layers during the epitaxial growth. In other words, Zn will be diffused into the layers located nearer to the substrate. When the p-type cladding layer provided beneath the p-type cap layer is doped with Zn, Zn in the p-type cladding layer will be pushed out and diffused into the active layer (push-out diffusion). On the other hand, when the p-type cladding layer is doped with Mg, Zn in the p-type cap layer will be diffused at a burst into the active layer by a mutual diffusion. For either case, there are disadvantages in that a half bandwidth of a photoluminescence spectrum (hereinafter, referred as "PL half bandwidth") of the active layer becomes greater, or that an emission intensity is decreased. In other words, damages for a crystal quality of the active layer due to the diffusion of Zn causes the elevations of a threshold current and a operating current and the deterioration in product reliability.

SUMMARY OF THE INVENTION

Accordingly, it is an object of the invention to solve the above problems and to provide an epitaxial wafer for a semiconductor light emitting device and a method for fabricating the same, in which the diffusion of the p-type dopant into the p-type cladding layer and the active layer can be suppressed, and to provide a semiconductor light emitting device by using the epitaxial wafer in that the operation with a high power at a high temperature can be realized and a high reliability can be obtained.

According to the first feature of the invention, an epitaxial wafer for a semiconductor light emitting device comprises a n-type cladding layer, an active layer, a p-type cladding layer, and a p-type cap layer sequentially grown on a n-type substrate, in which a p-type dopant of the p-type cap layer is Zn and a C-doped p-type AlGaAs layer is interposed between the p-type cladding layer and the p-type cap layer.

In the epitaxial wafer for a semiconductor light emitting device, it is preferable that the n-type substrate is composed of GaAs, the n-type cladding layer comprises at least one layer composed of AlGaInP, the p-type cladding layer comprises at least one layer composed of AlGaInP, the p-type cap layer is composed of GaAs, and a bandgap wavelength of the C-doped p-type AlGaAs layer is longer than a bandgap wavelength of the p-type cladding layer.

The epitaxial wafer for a semiconductor light emitting device may further comprise a p-type intermediate layer interposed between the C-doped p-type AlGaAs layer and the p-type cap layer.

In the epitaxial wafer for a semiconductor light emitting device, it is preferable that the p-type intermediate layer comprises at least one layer composed of GaInP or AlGaInP, and a bandgap wavelength of the C-doped p-type AlGaAs layer is longer than a bandgap wavelength of the p-type cladding layer and shorter than a bandgap wavelength of the p-type intermediate layer.

The epitaxial wafer for a semiconductor light emitting device may further comprise a second p-type cladding layer, and a p-type etching stopper layer interposed between the p-type cladding layer and the second p-type cladding layer, in which the C-doped p-type AlGaAs layer is interposed between the second p-type cladding layer and the p-type intermediate layer.

In the epitaxial wafer for a semiconductor light emitting device, the second p-type cladding layer is composed of AlGaInP.

In the epitaxial wafer for a semiconductor light emitting device, the p-type etching stopper layer may comprise at least one layer composed of GaInP or AlGaInP.

In the epitaxial wafer for a semiconductor light emitting device, a p-type dopant for the p-type cladding layer may be Zn or Mg. Further, a p-type dopant for the second p-type cladding layer may be Zn or Mg.

In the epitaxial wafer for a semiconductor light emitting device, the p-type cap layer may have a carrier concentration of $1 \times 10^{19}/cm^3$ or more.

In the epitaxial wafer for a semiconductor light emitting device, the C-doped p-type AlGaAs layer may have an Al composition ratio of 0.70 to 0.95.

According to the second feature of the invention, a method for fabricating an epitaxial wafer for a semiconductor light emitting device comprises the step of epitaxially growing a n-type cladding layer, an active layer, a p-type cladding layer, a C-doped p-type AlGaAs layer, and a p-type cap layer sequentially on a n-type substrate, in which a p-type dopant of the p-type cap layer is Zn.

In the method for fabricating an epitaxial wafer for a semiconductor light emitting device, doping of the C-doped p-type AlGaAs layer may be conducted by auto-doping of a metalorganic source by adjusting a V/III ratio between a III group source and a V group source.

In the method for fabricating an epitaxial wafer for a semiconductor light emitting device, doping of the C-doped p-type AlGaAs layer may be conducted by auto-doping of a metalorganic source by adjusting a growth temperature.

According to the third feature of the invention, a semiconductor light emitting device is fabricated by using an epitaxial wafer for a semiconductor light emitting device comprising a n-type cladding layer, an active layer, a p-type cladding layer, and a p-type cap layer sequentially grown on a n-type substrate, in which a p-type dopant of the p-type cap layer is Zn and a C-doped p-type AlGaAs layer is interposed between the p-type cladding layer and the p-type cap layer.

The Inventor has found that (1) Zn in the p-type cap layer is hardly diffused into the p-type cladding layer, when the AlGaAs layer is interposed between the p-type cap layer and the p-type cladding layer, and that (2) the Zn-diffusion suppressing effect provided by this AlGaAs layer effectively functions for either case in that the p-type dopant of the p-type cladding layer is Zn or Mg.

The present invention is based on the aforementioned Inventor's knowledge. According to the invention, an epitaxial wafer for a semiconductor light emitting device has a configuration in that at least a n-type cladding layer, an active layer, a p-type cladding layer, and a p-type cap layer (contact layer) are sequentially laminated on a n-type substrate and a p-type dopant for the p-type cap layer provided as an uppermost layer is Zn, in which an AlGaAs layer is interposed between the p-type cladding layer and the p-type cap layer.

Further, according to the invention, an epitaxial wafer for a semiconductor light emitting device has a configuration in that at least a n-type cladding layer, an active layer, a p-type cladding layer, a p-type intermediate layer, and a p-type cap layer (contact layer) are sequentially laminated on a n-type substrate and a p-type dopant for the p-type cap layer provided as an uppermost layer is Zn, in which an AlGaAs layer is interposed between the p-type cladding layer and the p-type intermediate layer.

According to these structures, the AlGaAs layer functions as a Zn-diffusion suppressing layer which suppresses the diffusion of Zn doped in the p-type cap layer, so that Zn will be hardly diffused to the layers located at a p-type cladding layer side and an active layer side with respect to the interposed AlGaAs layer. As a result, it is possible to solve the conventional problems in that light emission characteristics of the active layer and the lifetime of the device are deteriorated.

The aforementioned diffusion suppressing effect is provided by virtue of the interposed layer being the AlGaAs layer. Therefore, so as to provide only the diffusion suppressing effect, it is not absolutely necessary that the AlGaAs layer is a C-doped p-type layer. However, when the epitaxial wafer for a light emitting device is fabricated for practical purposes, the interposed AlGaAs layer should be provided as a low resistance layer having a resistance sufficiently low, such that the AlGaAs layer will not function as a resistance component of the device. For this reason, in the present invention, it is required that the AlGaAs layer is a p-type AlGaAs layer doped with carbon with a small diffusion coefficient.

In addition, according to this structure, the diffusion of Zn doped in the p-type cap layer can be prevented, so that the concentration of Zn in the p-type cap layer can be kept high, and the contact resistance between the cap layer and the electrode can be lowered. As a result, a forward operating voltage of the semiconductor light emitting device can be decreased.

In the present invention, the AlGaAs layer is interposed between the p-type cladding layer and the p-type intermediate layer (or at an interface therebetween). Alternatively, the AlGaAs layer is interposed between the p-type cladding layer and the p-type cap layer (or at an interface therebetween), so as to prevent the diffusion of Zn doped in the cap layer. Further, the AlGaAs layer is provided as the C-doped p-type layer such that the AlGaAs layer will not function as the resistance layer, so as to suppress the increase of the forward operating voltage of the semiconductor light emitting device. The aforementioned technical idea has not been proposed in the conventional arts.

The aforementioned Zn-diffusion suppressing effect of the AlGaAs layer effectively functions for either case in that the p-type dopant of the p-type cladding layer is Zn or Mg. Therefore, an applicable range of the present invention is very wide. Even in an epitaxial wafer for a semiconductor light emitting device fabricated by epitaxially growing a compound semiconductor of AlGaInP-based material on a GaAs substrate by using Zn or Mg as a p-type dopant, an expected Zn-diffusion suppressing effect can be obtained by interposing the C-doped p-type AlGaAs layer between the p-type cladding layer and the p-type intermediate layer (or at an interface therebetween).

According to the present invention, the C-doped p-type AlGaAs layer is interposed between the p-type cladding layer and the p-type cap layer (or at the interface therebetween), or between the p-type cladding layer and the p-type intermediate layer (or at the interface therebetween), and the C-doped p-type AlGaAs layer functions as the Zn-diffusion suppressing layer for suppressing the diffusion of Zn doped in the p-type cap layer, so that Zn will be hardly diffused to the layers located at the p-type cladding layer side and the active layer side with respect to the C-doped AlGaAs layer. In other words, it is possible to suppress the diffusion of Zn of the Zn-doped p-type cap layer having a high carrier concentration into the p-type cladding layer and particularly into the active layer very effectively, so that the light emission characteristics of the active layer and the lifetime of the device will not be deteriorated. As a result, the cap layer can be doped to have a high carrier concentration such that the contact resistance between the cap layer and the electrode can be kept low enough. Therefore, it is possible to provide an epitaxial wafer for a semiconductor light emitting device, which is suitable for fabricating a light emitting device such as a red semiconductor lasers with high reliability, which is excellent in the high power and high temperature properties.

By the way, when comparing the diffusion of the dopant from the p-type cladding layer into the active layer with the diffusion of Zn from the p-type cap layer into the active layer, it is the diffusion of Zn from the p-type cap layer that actually has a great influence on the properties of the light emitting device, since the concentration of Zn in the p-type cap layer is higher than the concentration of the dopant in the p-type cladding layer. Therefore, according to the present invention, it is possible to fabricate the light emitting device such as a red semiconductor lasers with high reliability more effectively, compared with the case where the diffusion of the dopant from the p-type cladding layer to the active layer is suppressed.

BRIEF DESCRIPTION OF THE DRAWINGS

Preferred embodiment according to the invention will be described in conjunction with appended drawings, wherein.

DETAILED DESCRIPTION OF PREFERRED EMBODIMENTS

Next, an epitaxial wafer for a semiconductor light emitting device, a method for fabricating the same, and a semiconductor light emitting device using the epitaxial wafer in the preferred embodiments according to the present invention will be explained in more detail in conjunction with the appended drawings.

The First Preferred Embodiment

Figure 1:
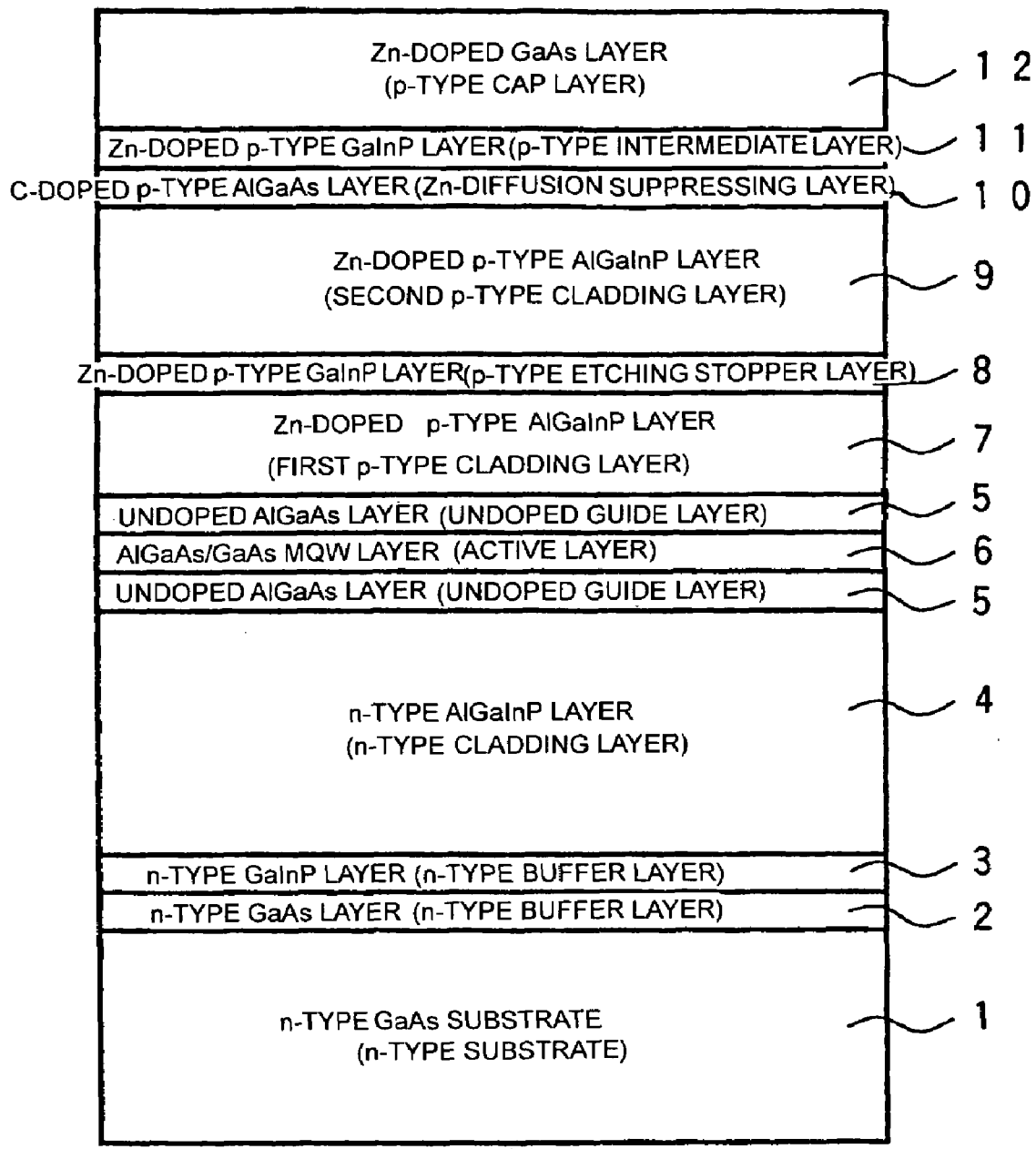
FIG. 1 is a cross sectional schematic block diagram showing an epitaxial wafer for a semiconductor light emitting device in the first preferred embodiment according to the invention.

FIG. 1 shows an epitaxial wafer for a semiconductor light emitting device (LD) having a configuration in which a n-type GaAs layer (n-type buffer layer) 2, a n-type GaInP layer (n-type buffer layer) 3, a n-type AlGaInP layer (n-type cladding layer) 4, an undoped AlGaAs layer (undoped guide layer) 5, an AlGaAs/GaAs multiquantum well (MQW) layer (active layer) 6, a Zn-doped p-type AlGaInP layer (first p-type cladding layer) 7, a Zn-doped p-type GaInP layer (p-type etching stopper layer) 8, a Zn-doped p-type AlGaInP layer (second p-type cladding layer) 9, a C-doped AlGaAs layer (Zn-diffusion suppressing layer) 10 (which is an essential feature of the present invention), a Zn-doped p-type GaInP layer (p-type intermediate layer) 11, and a Zn-doped GaAs layer (p-type cap layer) 12 are sequentially grown on a GaAs substrate (n-type substrate) 1. The p-type dopant used for doping the first p-type cladding layer 7, the second p-type cladding layer 9, the p-type etching stopper layer 8, and the p-type intermediate layer 11 is Zn. The p-type etching stopper layer 8 may be composed of AlGaInP.

In the above structure, the Zn-doped p-type intermediate layer 11 is provided to reduce a resistance component at an interface between the second Zn-doped p-type cladding layer 9 and the Zn-doped p-type GaAs cap layer 12 due to a bandgap discontinuity therebetween.

As for the aluminum (Al) composition of the C-doped p-type AlGaAs layer (p-type Zn-diffusion suppressing layer) 10 doped with the carbon, a bandgap wavelength thereof is longer than that of the second p-type cladding layer 9 and shorter than that of the p-type intermediate layer 11. This is to reduce a resistance component at interface between the second p-type cladding layer 9 and the C-doped AlGaAs layer (p-type Zn-diffusion suppressing layer) 10, and a resistance component at interface between the C-doped AlGaAs layer (p-type Zn-diffusion suppressing layer) 10 and the p-type intermediate layer 11, due to the bandgap discontinuities therebetween. Further, the C-doped p-type AlGaAs layer may have an Al composition ratio of 0.70 to 0.95.

According to the structure shown in FIG. 1, the C-doped AlGaAs layer 10 functions as the Zn-diffusion suppressing layer for suppressing the diffusion of Zn doped in the p-type cap layer 12, so that Zn will not be diffused to layers located at the active layer side with respect to the C-doped AlGaAs layer 10. The Zn-diffusion suppressing effect given by this C-doped AlGaAs layer functions effectively for either case in that the p-type dopant of the p-type cladding layer is Zn or Mg. In addition, the resistance which may increase the forward operating voltage in the semiconductor light emitting device will not be produced, since the AlGaAs layer is doped with the carbon.

Doping of carbon to the AlGaAs layer interposed between the p-type cladding layer and the p-type intermediate layer is not achieved by a method of intentionally doping the impurity, but by the auto-doping in which a V/III ratio of a III group source and a V group source is adjusted.

In other words, the doping amount of the carbon to the C-doped AlGaAs layer 10 is controlled by adjusting the V/III ratio between the III group source and the V group source.

The doping of the C-doped p-type AlGaAs layer 10 may be also conducted by auto-doping of the metalorganic source by adjusting a growth temperature.

The Second Preferred Embodiment

Figure 2:
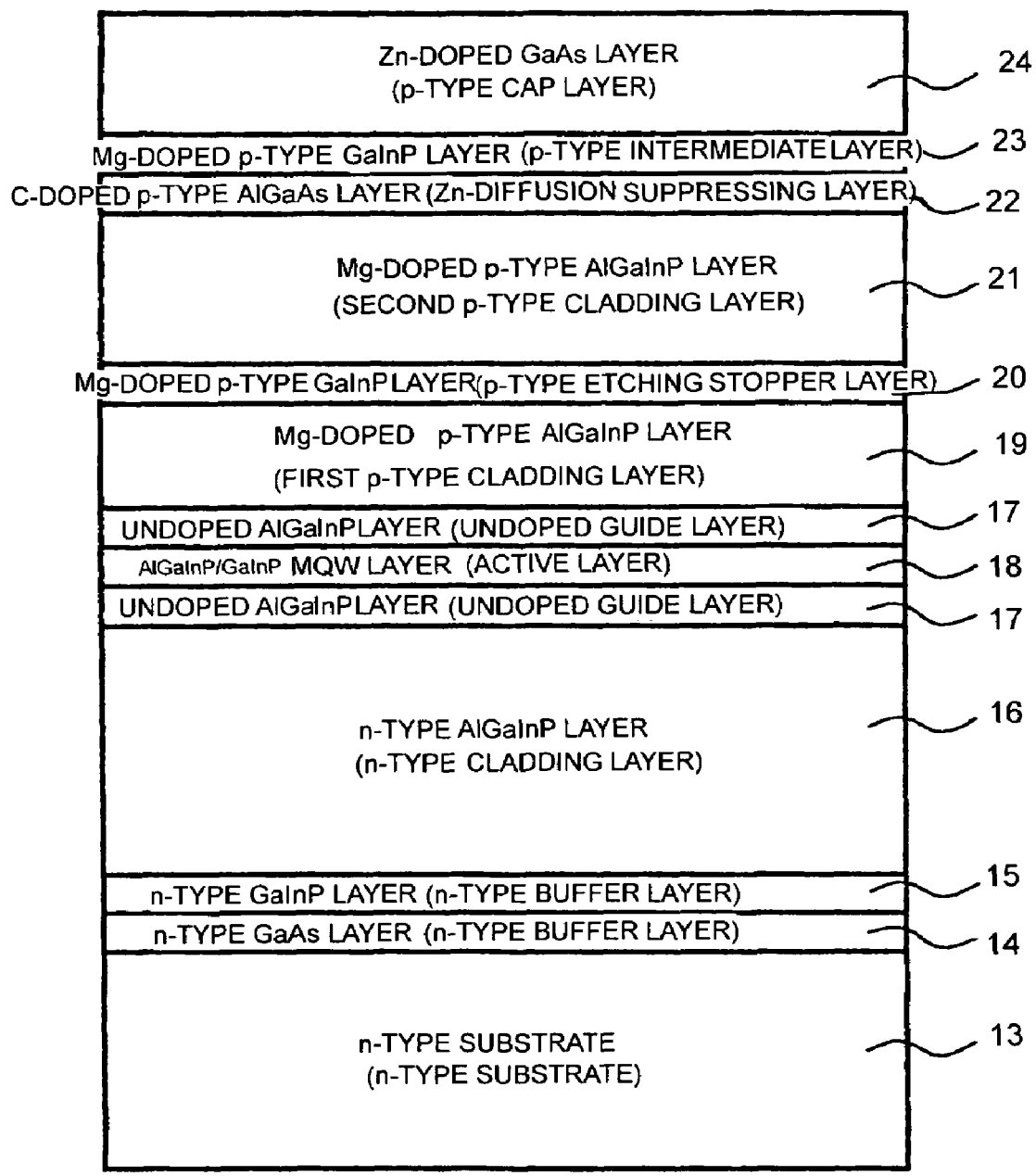
FIG. 2 is a cross sectional schematic block diagram showing an epitaxial wafer for a semiconductor light emitting device in the second preferred embodiment according to the invention.

FIG. 2 shows an epitaxial wafer for a semiconductor light emitting device (LD) having a configuration in which a n-type GaAs layer (n-type buffer layer) 14, a n-type GaInP layer (n-type buffer layer) 15, a n-type AlGaInP layer (n-type cladding layer) 16, an undoped AlGaInP layer (undoped guide layer) 17, an AlGaInP/GaInP multiquantum well (MQW) layer (active layer) 18, a Mg-doped p-type AlGaInP layer (first p-type cladding layer) 19, a Mg-doped p-type GaInP layer (p-type etching stopper layer) 20, a Mg-doped p-type AlGaInP layer (second p-type cladding layer) 21, a C-doped p-type AlGaAs layer (Zn-diffusion suppressing layer) 22 (which is an essential feature of the present invention), a Mg-doped p-type GaInP layer (p-type intermediate layer) 23 or a p-type intermediate layer 23 having a multi-layered structure in which a plurality of Mg-doped p-type AlGaInP thin films having different Al compositions and a plurality of Mg-doped p-type GaInP thin films are laminated, and a Zn-doped p-type GaAs layer (p-type cap layer) 24 are sequentially grown on a n-type GaAs substrate (n-type substrate) 13. The p-type dopant used for doping the first p-type cladding layer 19, the second p-type cladding layer 21, the p-type etching stopper layer 20, and the p-type intermediate layer 23 is Mg. The p-type etching stopper layer 22 may be composed of AlGaInP or may comprise GaInP layers and AlGaInP layers.

In the above structure, the Mg-doped p-type intermediate layer 23 is provided to reduce a resistance component at an interface between the Mg-doped second p-type cladding layer 21 and the Zn-doped p-type GaAs cap layer 24 due to a bandgap discontinuity therebetween.

As for the aluminum (Al) composition of the C-doped AlGaAs layer (p-type Zn-diffusion suppressing layer) 22 doped with the carbon, a bandgap wavelength thereof is longer than that of the second p-type cladding layer 21 and shorter than that of a layer having the shortest bandgap wavelength in the p-type intermediate layer 23. This is to reduce a resistance component at an interface between the second p-type cladding layer 21 and the C-doped AlGaAs layer (p-type Zn-diffusion suppressing layer) 22, and a resistance component at an interface between the C-doped AlGaAs layer 22 and the p-type intermediate layer 23, due to the bandgap discontinuities therebetween. Further, the C-doped p-type AlGaAs layer may have an Al composition ratio of 0.70 to 0.95.

According to the structure shown in FIG. 2, the C-doped AlGaAs layer 22 functions as the Zn-diffusion suppressing layer for suppressing the diffusion of Zn doped in the p-type cap layer 24, so that Zn will not be diffused to the layers located at the p-type cladding layer side with respect to the C-doped AlGaAs layer 22. The Zn-diffusion suppressing effect given by this C-doped AlGaAs layer 22 functions effectively for either case in that the p-type dopant of the p-type cladding layers is Zn or Mg. In addition, the resistance which may increase the forward operating voltage in the semiconductor light emitting device will not be produced, since the AlGaAs layer is doped with the carbon.

Doping of the carbon to the AlGaAs layer interposed between the p-type cladding layer and the p-type intermediate layer is not achieved by a method of intentionally doping the impurity, but by the auto-doping in which a V/III ratio of a III group source and a V group source is adjusted.

In other words, the doping amount of the carbon to the C-doped AlGaAs layer 22 is controlled by adjusting the V/III ratio between the III group source and the V group source.

The doping of the C-doped p-type AlGaAs layer 22 may be also conducted by auto-doping of the metalorganic source by adjusting a growth temperature.

EXAMPLE 1

As the example 1, an epitaxial wafer for a semiconductor light emitting device shown in FIG. 1 was fabricated.

As shown in FIG. 1, a Si-doped n-type GaAs buffer layer 2, a Si-doped n-type $Ga_{0.5}In_{0.5}P$ buffer layer 3, which is lattice matched with the Si-doped n-type GaAs buffer layer 2, and a Si-doped n-type $(Al_{0.7}Ga_{0.3})_{0.5}In_{0.5}P$ cladding layer 4 are epitaxially grown on a n-type GaAs substrate 1 sequentially, and further an undoped $Al_{0.34}Ga_{0.66}As$ guide layer 5, a multiquantum well (MQW) active layer 6 comprising undoped $Al_{0.34}Ga_{0.66}As$ barrier layers and undoped $Al_{0.11}Ga_{0.89}As$ well layers, a first Zn-doped p-type $(Al_{0.7}Ga_{0.3})_{0.5}In_{0.5}P$ cladding layer 7, a Zn-doped p-type $Ga_{0.5}In_{0.5}P$ etching stopper layer 8, and a second Zn-doped p-type $(Al_{0.7}Ga_{0.3})_{0.5}In_{0.5}P$ cladding layer 9 are sequentially grown thereon.

Further, a C-doped p-type $Al_{0.85}Ga_{0.15}As$ layer 10 functioning as a Zn-diffusion suppressing layer (which is an essential feature of the invention), a Zn-doped p-type $Ga_{0.5}In_{0.5}P$ intermediate layer 11, and a Zn-doped p-type GaAs cap layer 12 are sequentially grown thereon. Herein, the C-doped p-type $Al_{0.85}Ga_{0.15}As$ layer 10 has an Al composition ratio of 0.85 and a thickness of 40 nm, and a carrier concentration for auto-doping of the carbon (C) by adjustment of the V/III ratio is $8 \times 10^{17}/cm^3$. Further, the Zn-doped p-type $Ga_{0.5}In_{0.5}P$ intermediate layer 11 has a thickness of 50 nm and a carrier concentration of $2 \times 10^{18}/cm^3$, and the Zn-doped p-type GaAs cap layer 12 has a thickness of 450 nm and a carrier concentration of $1 \times 10^{19}/cm^3$.

Comparative Example

As a comparative example, an epitaxial wafer for a semiconductor light emitting device having a same structure as the structure shown in FIG. 1, except that the C-doped $Al_{0.85}Ga_{0.15}As$ layer 10 functioning as a Zn-diffusion suppressing layer C-doped is not interposed, was fabricated.

The Zn distribution status in the epitaxial wafer for a semiconductor light emitting device having a layer configuration in the Example 1 (the present invention) was examined by SIMS analysis.

Figure 3:
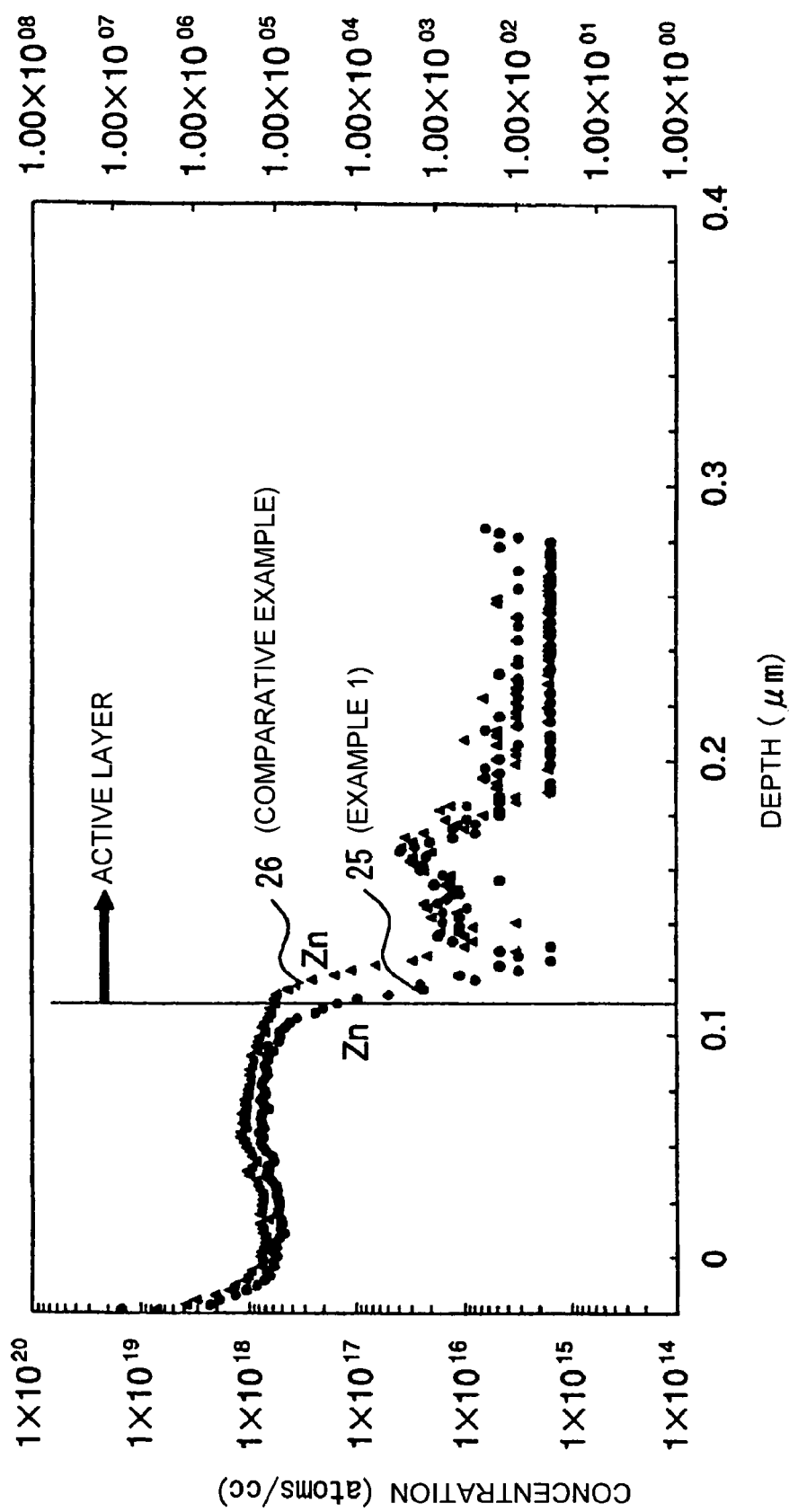
FIG. 3 is a graph for showing a comparison between a SIMS analysis result of a conventional epitaxial wafer for a semiconductor light emitting device in a comparative example and that of an epitaxial wafer for a semiconductor light emitting device in Example 1 in which a Zn-diffusion suppressing layer is provided.

FIG. 3 shows a comparison between a SIMS analysis result of the epitaxial wafer for a semiconductor light emitting device in the Example 1 in which a Zn-diffusion suppressing layer is provided and the epitaxial wafer for a semiconductor light emitting device in the comparative example. In FIG. 3, a curve 25 indicates a distribution profile of Zn in the structure shown in FIG. 1 (Example 1), and a curve 26 indicates a distribution profile of Zn of the comparative example. In FIG. 3, the analysis result is magnified for the layers located at the active layer side with respect to the etching stopper layer so as to clearly show a difference between the Example 1 and the comparative example. In FIG. 3, a vertical axis shows the concentration of Zn and a horizontal axis shows the depth from an upper surface of the first p-type cladding layer in the epitaxial wafer.

For the case of the comparative example (curve 26), it is clearly confirmed that the push-in of Zn to the active layer occurs in addition to the elevation of the Zn level in the cladding layer. On the other hand, for the case of the Example 1 (curve 25), it is found that a level of the diffusion of Zn to the active layer is negligibly low.

In addition, the device characteristics of an infrared high power semiconductor laser (an infrared side laser for a monolithic two wavelength laser) fabricated by using the epitaxial wafer for a semiconductor light emitting device in the Example 1 were remarkably good.

EXAMPLE 2

As the example 2, an epitaxial wafer for a semiconductor light emitting device shown in FIG. 2 was fabricated.

As shown in FIG. 2, a Si-doped n-type GaAs buffer layer 14, a Si-doped n-type GaInP buffer layer 15, which is lattice matched with the Si-doped n-type GaAs buffer layer 14, and a Si-doped n-type $(Al_{0.7}Ga_{0.3})_{0.5}In_{0.5}P$ cladding layer 16 are epitaxially grown on a n-type GaAs substrate 13 sequentially, and further an undoped $(Al_{0.5}Ga_{0.5})_{0.5}In_{0.5}P$ guide layer 17, a multiquantum well (MQW) active layer 18 comprising undoped $(Al_{0.5}Ga_{0.5})_{0.5}In_{0.5}P$ barrier layers and strain-GaInP well layers, a first Mg-doped p-type $(Al_{0.7}Ga_{0.3})_{0.5}In_{0.15}P$ cladding layer 19, a Mg-doped p-type $Ga_{0.5}In_{0.5}P$ etching stopper layer 20, and a second Mg-doped p-type $(Al_{0.7}Ga_{0.3})_{0.5}In_{0.5}P$ cladding layer 21 are sequentially grown thereon.

Further, a C-doped p-type $Al_{0.85}Ga_{0.15}As$ layer 22 functioning as a Zn-diffusion suppressing layer (which is an essential feature of the invention), a Mg-doped p-type $Ga_{0.5}In_{0.5}P$ intermediate layer 23, and a Zn-doped p-type GaAs cap layer 24 are sequentially grown thereon. Herein, the C-doped p-type $Al_{0.85}Ga_{0.15}As$ layer 22 has an Al composition ratio of 0.85 and a thickness of 35 nm, and a carrier concentration for auto-doping of the carbon (C) by adjustment of the V/III ratio is $1.1 \times 10^{18}/cm^3$. Further, the Mg-doped p-type $Ga_{0.5}In_{0.5}P$ intermediate layer 23 has a thickness of 35 nm and a carrier concentration of $2.5 \times 10^{18}/cm^3$, and the Zn-doped p-type GaAs cap layer 24 has a thickness of 200 nm and a carrier concentration of $2.5 \times 10^{19}/cm^3$.

Figure 4:
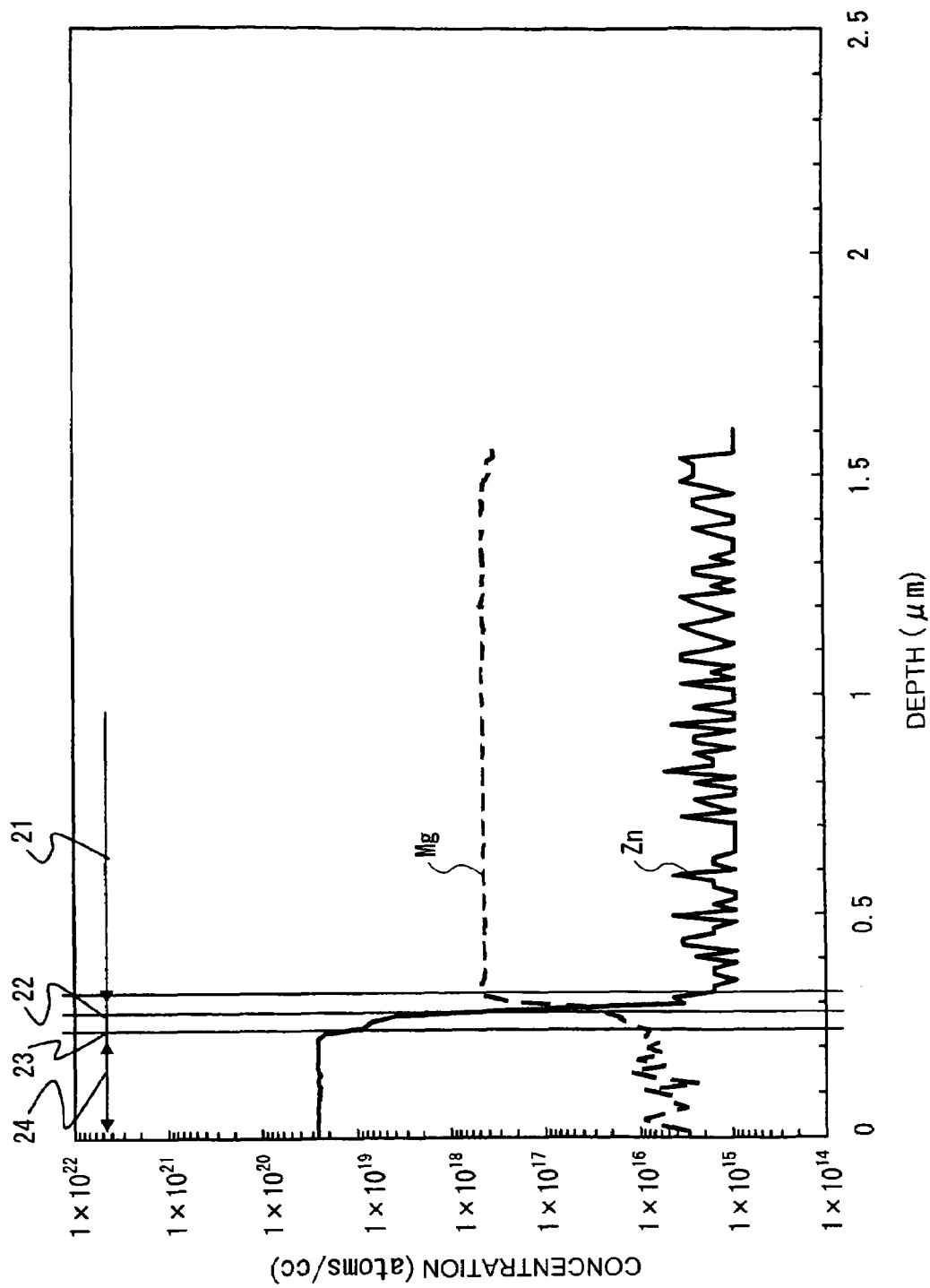
FIG. 4 is a graph for showing a SIMS analysis result of an epitaxial wafer for a semiconductor light emitting device in Example 2 in which a Zn-diffusion suppressing layer is provided.

The Zn and Mg distribution status in the epitaxial wafer for a semiconductor light emitting device having a layer configuration of the Example 2 (the present invention) was examined by the SIMS analysis. The analysis result is shown in FIG. 4. In FIG. 4, a vertical axis shows the concentration of the dopant (Zn and Mg) and a horizontal axis shows the depth from an upper surface of the p-type first cladding layer in the epitaxial wafer.

From the analysis result, it is found that Zn is hardly diffused to the layers located at the active layer side with respect to the Mg-doped second p-type cladding layer 21.

In addition, the device characteristics of a infrared high power semiconductor laser (an infrared side laser for a monolithic two wavelength laser) fabricated by using the epitaxial wafer for a semiconductor light emitting device in the Example 2 were also remarkably good.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching herein set forth.

What is claimed is:

1. An epitaxial wafer for a semiconductor light emitting device, comprising:
    an n-type cladding layer, an active layer, a p-type cladding layer, and a p-type cap layer sequentially grown on an n-type substrate,
    wherein a p-type dopant of the p-type cap layer is Zn and a C-doped p-type AlGaAs layer is interposed between the p-type cladding layer and the p-type cap layer,
    wherein the epitaxial wafer for the semiconductor light emitting device further comprises:
        a p-type intermediate layer interposed between the C-doped p-type AlGaAs layer and the p-type cap layer;
        a second p-type cladding layer; and
        a p-type etching stopper layer interposed between the p-type cladding layer and the second p-type cladding layer, and
    wherein the C-doped p-type AlGaAs layer is interposed between the second p-type cladding layer and the p-type intermediate layer.

2. The epitaxial wafer for a semiconductor light emitting device, according to claim 1, wherein:
    the p-type intermediate layer comprises at least one layer comprised of GaInP or AlGaInP, and the bandgap wavelength of the C-doped p-type AlGaAs layer is longer than the bandgap wavelength of the p-type cladding layer and shorter than a bandgap wavelength of the p-type intermediate layer.

3. The epitaxial wafer for a semiconductor light emitting device, according to claim 1, wherein:
    the second p-type cladding layer is comprised of AlGaInP.

4. The epitaxial wafer for a semiconductor light emitting device, according to claim 1, wherein:
    the p-type etching stopper layer comprises at least one layer comprised of GaInP or AlGaInP.

5. The epitaxial wafer for a semiconductor light emitting device, according to claim 1, wherein:
    a p-type dopant for the p-type cladding layer is Zn or Mg.

6. The epitaxial wafer for a semiconductor light emitting device, according to claim 1, wherein:
    a p-type dopant for the second p-type cladding layer is Zn or Mg.

7. The epitaxial wafer for a semiconductor light emitting device, according to claim 1, wherein:
    the p-type cap layer has a carrier concentration of $1 \times 10^{19}/cm^3$ or more.

8. The epitaxial wafer for a semiconductor light emitting device, according to claim 1, wherein:
    the C-doped p-type AlGaAs layer may have an Al composition ratio of 0.70 to 0.95.

9. An epitaxial wafer for a semiconductor light emitting device, comprising:
    an n-type cladding layer, an active layer, a p-type cladding layer, and a p-type cap layer sequentially grown on an n-type substrate,
    wherein a p-type dopant of the p-type cap layer is Zn and a C-doped p-type AlGaAs layer is interposed between the p-type cladding layer and the p-type cap layer,
    wherein the n-type substrate is comprised of GaAs, the n-type cladding layer comprises at least one layer comprised of AlGaInP, the p-type cladding layer comprises at least one layer comprised of AlGaInP, the p-type cap layer is comprised of GaAs, and a bandgap wavelength of the C-doped p-type AlGaAs layer is longer than a bandgap wavelength of the p-type cladding layer, wherein the epitaxial wafer for the semiconductor light emitting device further comprises:
a p-type intermediate layer interposed between the C-doped p-type AlGaAs layer and the p-type cap layer;
a second p-type cladding layer; and
a p-type etching stopper layer interposed between the p-type cladding layer and the second p-type cladding layer, and
wherein the C-doped p-type AlGaAs layer is interposed between the second p-type cladding layer and the p-type intermediate layer.

10. The epitaxial wafer for a semiconductor light emitting device, according to claim 9, wherein:
the p-type intermediate layer comprises at least one layer comprised of GaInP or AlGaInP, and the bandgap wavelength of the C-doped p-type AlGaAs layer is longer than the bandgap wavelength of the p-type cladding layer and shorter than a bandgap wavelength of the p-type intermediate layer.

11. The epitaxial wafer for a semiconductor light emitting device, according to claim 9, wherein:
the second p-type cladding layer is comprised of AlGaInP.

12. The epitaxial wafer for a semiconductor light emitting device, according to claim 9, wherein:
the p-type etching stopper layer comprises at least one layer comprised of GaInP or AlGaInP.

13. The epitaxial wafer for a semiconductor light emitting device, according to claim 9, wherein:
a p-type dopant for the p-type cladding layer is Zn or Mg.

14. The epitaxial wafer for a semiconductor light emitting device, according to claim 9, wherein:
a p-type dopant for the second p-type cladding layer is Zn or Mg.

15. The epitaxial wafer for a semiconductor light emitting device, according to claim 9, wherein:
the p-type cap layer has a carrier concentration of $1\times10^{19}/cm^3$ or more.

16. The epitaxial wafer for a semiconductor light emitting device, according to claim 9, wherein:
the C-doped p-type AlGaAs layer may have an Al composition ratio of 0.70 to 0.95.

17. A semiconductor light emitting device, fabricated by using an epitaxial wafer for a semiconductor light emitting device comprising a n-type cladding layer, an active layer, a p-type cladding layer, and a p-type cap layer sequentially grown on an n-type substrate, wherein:
a p-type dopant of the p-type cap layer is Zn and a C-doped p-type AlGaAs layer is interposed between the p-type cladding layer and the p-type cap layer;
the n-type substrate is comprised of GaAs, the n-type cladding layer comprises at least one layer comprised of AlGaInP, the p-type cladding layer comprises at least one layer comprised of AlGaInP, the p-type cap layer is comprised of GaAs, and a bandgap wavelength of the C-doped p-type AlGaAs layer is longer than a bandgap wavelength of the p-type cladding layer, the epitaxial wafer for the semiconductor light emitting device further comprises:
a p-type intermediate layer interposed between the C-doped p-type AlGaAs layer and the p-type cap layer;
a second p-type cladding layer; and
a p-type etching stopper layer interposed between the p-type cladding layer and the second p-type cladding layer, and
the C-doped p-type AlGaAs layer is interposed between the second p-type cladding layer and the p-type intermediate layer.

18. A method for fabricating an epitaxial wafer for a semiconductor light emitting device, comprising the step of:
epitaxially growing an n-type cladding layer, an active layer, a p-type cladding layer, a C-doped p-type AlGaAs layer, and a p-type cap layer sequentially on a n-type substrate,
wherein:
a p-type dopant of the p-type cap layer is Zn and a C-doped p-type AlGaAs layer is, as a result of the method, interposed between the p-type cladding layer and the p-type cap layer,
wherein the n-type substrate is comprised of GaAs, the n-type cladding layer comprises at least one layer comprised of AlGaInP, the p-type cladding layer comprises at least one layer comprised of AlGaInP, the p-type cap layer is comprised of GaAs, and a bandgap wavelength of the C-doped p-type AlGaAs layer is longer than a bandgap wavelength of the p-type cladding layer,
wherein, as a result of the method, the epitaxial wafer for the semiconductor light emitting device further comprises:
a p-type intermediate layer interposed between the C-doped p-type AlGaAs layer and the p-type cap layer;
a second p-type cladding layer; and
a p-type etching stopper layer interposed between the p-type cladding layer and the second p-type cladding layer, and
wherein, as a result of the method, the C-doped p-type AlGaAs layer is interposed between the second p-type cladding layer and the p-type intermediate layer.

19. The method for fabricating an epitaxial wafer for a semiconductor light emitting device, according to claim 18, wherein:
the C-doped p-type AlGaAs layer is doped by conducting auto-doping of a metalorganic source by adjusting a V/III ratio between a III group source and a V group source.

20. The method for fabricating an epitaxial wafer for a semiconductor light emitting device, according to claim 18, wherein:
the C-doped p-type AlGaAs layer is doped by conducting auto-doping of a metalorganic source by adjusting a growth temperature.

* * * * *